(12) United States Patent
Wang et al.

(10) Patent No.: US 8,099,865 B2
(45) Date of Patent: Jan. 24, 2012

(54) METHOD FOR MANUFACTURING A CIRCUIT BOARD HAVING AN EMBEDDED COMPONENT THEREIN

(75) Inventors: Yung Hui Wang, Kaohsiung (TW); Ying Te Ou, Kaohsiung (TW)

(73) Assignee: Advanced Semiconductor Engineering, Inc., Pingtung (TW)

( * ) Notice: Subject to any disclaimer, the term of this patent is extended or adjusted under 35 U.S.C. 154(b) by 847 days.

(21) Appl. No.: 12/142,853

(22) Filed: Jun. 20, 2008

(65) Prior Publication Data

US 2009/0249618 A1  Oct. 8, 2009

(30) Foreign Application Priority Data

Apr. 2, 2008  (TW) ................. 97111985 A

(51) Int. Cl.
*H05K 3/04* (2006.01)
*H05K 3/30* (2006.01)

(52) U.S. Cl. ............... 29/830; 29/841; 29/847; 29/874; 29/884; 174/260

(58) Field of Classification Search ............ 29/830–847, 29/852, 874, 884; 174/260
See application file for complete search history.

(56) References Cited

U.S. PATENT DOCUMENTS

| | | | |
|---|---|---|---|
| 6,194,250 B1* | 2/2001 | Melton et al. | 438/126 |
| 6,486,537 B1* | 11/2002 | Liebhard | 257/667 |
| 6,512,182 B2* | 1/2003 | Takeuchi et al. | 174/256 |
| 6,515,356 B1* | 2/2003 | Shin et al. | 257/678 |
| 6,586,824 B1* | 7/2003 | Glenn et al. | 257/680 |
| 6,746,894 B2* | 6/2004 | Fee et al. | 438/106 |
| 6,790,712 B2* | 9/2004 | Bai | 438/126 |
| 6,841,423 B2* | 1/2005 | Farnworth | 438/127 |
| 7,033,862 B2* | 4/2006 | Chen | 438/110 |
| 7,350,296 B2* | 4/2008 | Ryu et al. | 29/852 |
| 7,435,910 B2* | 10/2008 | Sakamoto et al. | 174/260 |
| 7,514,770 B2* | 4/2009 | Chang et al. | 257/678 |
| 7,525,814 B2* | 4/2009 | Yuri et al. | 361/761 |
| 7,594,316 B2* | 9/2009 | Noda et al. | 29/830 |
| 7,649,361 B2* | 1/2010 | Borland et al. | 324/548 |
| 7,653,991 B2* | 2/2010 | Mok et al. | 29/847 |
| 7,791,174 B2* | 9/2010 | Johnson | 257/621 |
| 2002/0185303 A1* | 12/2002 | Takeuchi et al. | 174/256 |
| 2004/0020047 A1* | 2/2004 | Nishikawa et al. | 29/852 |
| 2004/0045738 A1* | 3/2004 | Sugawa et al. | 174/262 |

(Continued)

FOREIGN PATENT DOCUMENTS

TW  095104698  2/2006

*Primary Examiner* — Derris Banks
*Assistant Examiner* — Kaying Kue

(57) ABSTRACT

A method for manufacturing a circuit board includes the following steps. First, a core layer is provided, wherein the core layer includes a first dielectric layer, and first and second metallic layers. A through hole is formed in the core layer. The core layer is disposed on a supporting plate, and an embedded component is disposed in the through hole, wherein the second metallic layer contacts the supporting plate, and the embedded component has at least one electrode contacting the supporting plate. The embedded component is mounted in the through hole. The supporting plate is removed. The first and second metallic layers are removed, and the thickness of the electrode of the embedded component is decreased. Third and fourth metallic layers are formed respectively, wherein the fourth metallic layer is electrically connected to the electrode of the embedded component. Finally, the third and fourth metallic layers are patterned so as to respectively form first and second patterned circuit layers.

18 Claims, 10 Drawing Sheets

U.S. PATENT DOCUMENTS

| | | | |
|---|---|---|---|
| 2006/0191711 A1* | 8/2006 | Cho et al. | 174/260 |
| 2006/0248717 A1* | 11/2006 | Lauffer et al. | 29/846 |
| 2007/0143993 A1* | 6/2007 | Hsu | 29/832 |
| 2008/0041619 A1* | 2/2008 | Lee et al. | 174/260 |
| 2008/0220566 A1* | 9/2008 | Hsieh et al. | 438/118 |
| 2011/0061232 A1* | 3/2011 | Kawamura et al. | 29/832 |

* cited by examiner

METHOD FOR MANUFACTURING A CIRCUIT BOARD HAVING AN EMBEDDED COMPONENT THEREIN

CROSS REFERENCE TO RELATED APPLICATION

This application claims the priority benefit of Taiwan Patent Application Serial Number 097111985, filed Apr. 2, 2008, the full disclosure of which is incorporated herein by reference.

BACKGROUND OF THE INVENTION

1. Field of the Invention

The present invention generally relates to a method for manufacturing a circuit board, and more particularly to a method for manufacturing a circuit board having an embedded component therein, the method decreasing the thickness of the electrode of the embedded component by a thickness decreasing process.

2. Description of the Related Art

A conventional circuit board is mainly constituted by repeatedly laminating a patterned circuit layer and a dielectric layer to each other. The patterned circuit layers are formed by photolithography and etching processes, and the dielectric layer is disposed between two of the patterned circuit layers for isolating the two neighbor circuit layers from each other. In addition, the two neighbor circuit layers are electrically connected to each other by a plating through hole (PTH) or a conductive via passing through the dielectric layer. Finally, various electronic elements (e.g. active components or passive component) are disposed on the surface of the circuit board, and achieve an objective of electrical signal propagation by means of a circuit design of inner traces.

Generally, the electronic elements are soldered on the surface of the circuit board of the conventional electronic product. However, the market demand is that an electronic product is light, thin, short, small and conveniently carried. Thus, an electronic element is designed to an embedded component embedded in the circuit board of the current electronic product so as to increase a wiring area on the surface of the circuit board and to achieve the objective of miniaturization of the electronic product.

FIGS. 1 to 5 depict that a conventional method for manufacturing a circuit board having an embedded component therein. Referring to FIG. 1, a core layer 110 is firstly provided, wherein the core layer 110 includes a first dielectric layer 112, a first patterned circuit layer 114 and a second patterned circuit layer 116. The first patterned circuit layer 114 and the second patterned circuit layer 116 are located on the upper surface 112a and the lower surface 112b of the first dielectric layer 112 respectively.

Referring to FIG. 2, a through hole H1 is formed in the core layer 110, and an embedded component E is disposed in the through hole H1, wherein the embedded component E has two sides 112c, 112d and two electrodes E1, the two sides 112c, 112d face the first dielectric layer 112, and the two electrodes E1 are located on the two sides 112c, 112d of the embedded component E respectively.

Referring to FIG. 3, first and second stacking layers 120, 130 are disposed on the first and second patterned circuit layers 114, 116 respectively, wherein the first stacking layer 120 includes a first metallic layer 122 and a second dielectric layer 124, the second stacking layer 130 includes a second metallic layer 132 and a third dielectric layer 134, and the second and third dielectric layers 124, 134 face the first and second patterned circuit layers 114, 116 respectively.

Referring to FIG. 4, the first stacking layers 120, the core layer 110 and the second stacking layers 130 are laminated, and at least one conductive via H2 and a plurality of conductive vias V are formed. The conductive via H2 passes through the first stacking layer 120, the core layer 110 and the second stacking layer 130, whereby the first metallic layer 122 and the second dielectric layer 124 can be electrically connected to each other by the conductive via H2. In addition, the two electrodes E1 of the embedded component E can be electrically connected to the first metallic layer 122 and the second metallic layer 132 respectively by the conductive vias V.

Referring to FIG. 5, the first metallic layer 122 and the second metallic layer 132 are patterned so as to respectively form a first surface circuit 122' and a second surface circuit 132'. The first surface circuit 122' and the second surface circuit 132' are electrically connected to each other by the conductive via H2, and the two electrodes E1 of the embedded component E are electrically connected to the first surface circuit 122' and the second surface circuit 132' by the conductive vias V so as to finish the conventional method for manufacturing a circuit board having an embedded component therein.

However, the embedded component E in the conventional method for manufacturing a circuit board must be electrically connected to the first surface circuit 122' and the second surface circuit 132' by the conductive vias V such that wiring areas on the first patterned circuit layer 114 and the second patterned circuit layer 116 are decreased, and further wiring densities on the first patterned circuit layer 114 and the second patterned circuit layer 116 are decreased. In addition, the embedded component E must be electrically connected to the first surface circuit 122' and the second surface circuit 132' by the conductive vias V such that the thickness of the whole circuit board can be increased. Thus, the conventional circuit board can not meet the requirements of light, thin, short and small product.

Taiwan Patent Application Number 095104698 is filed on Feb. 13, 2006 (the application date). The applicant of this Taiwan patent application is same as that of the present application: Advanced Semiconductor Engineering, Inc. This patent application discloses a conventional method for manufacturing a board having an embedded component therein including the following steps as follows. Firstly, a core layer 210 is provided, wherein the core layer 210 includes a dielectric layer 212, a first patterned circuit layer 214 and a second patterned circuit layer 216. The first patterned circuit layer 214 and the second patterned circuit layer 216 are located on the upper surface 212a and the lower surface 212b of the dielectric layer 212. A through hole H3 is formed in the core layer 210. The core layer 210 is disposed on a supporting plate (nor shown), and an embedded component E' is disposed in the through hole H3, wherein the embedded component E has two sides 212c, 212d and at least one electrode E1', the two sides 212c, 212d face the dielectric layer 212, and the electrode E1' is located on the sides 212c, 212d of the embedded component E'. The embedded component E' is mounted in the through hole H3 by an adhesive in an encapsulating process. The supporting plate is removed. Finally, the electrode E1' of the embedded component E' is electrically connected to the second patterned circuit layer 216 by forming a metallic layer L on the lower surface 212b of the dielectric layer 212, shown in FIG. 6. It is not necessary that the embedded component E' of this Taiwan patent application is electrically connected to a surface circuit by a convention conductive via, whereby wiring areas on the first patterned circuit layer 214 and the second patterned circuit layer 216 can be increased, and further wiring densities on the first patterned circuit layer 214 and the second patterned circuit layer 216 can be increased. In addition, it is not necessary that the embedded component E' is electrically connected to the surface circuit by the convention conductive via, whereby the thickness of the whole circuit board cannot be increased. Thus, the circuit board can meet the requirements of light, thin, short and small product.

However, this Taiwan patent application only discloses that the electrode E1' of the embedded component E' is located on the sides 212c, 212d (the sides 212c, 212d face the dielectric layer 212) of the embedded component E', but fails to disclose that the electrode E1' of the embedded component E' is located on an upper surface 212a or a lower surface 212b of the embedded component E' (the upper surface 212a and the lower surface 212b does not face the dielectric layer 212).

U.S. Pat. No. 7,033,862 B2, entitled "Method of Embedding Semiconductor Element in Carrier and Embedded Structure Thereof", discloses a conventional method for embedding a semiconductor element in carrier including the following steps as follows. Firstly, a carrier 310 having a through hole 301 is provided, and an auxiliary material 311 is attached to a lower side of the carrier 310. A semiconductor element 312 is placed in the through hole 301 of the carrier 310. Then, a medium material 313 and a glue 314 are applied in order in the through hole 301 to firmly position the semiconductor element 312 in the hole 301 of the carrier 310 by the glue 314. Finally, the auxiliary material 311 and the medium material 313 are removed so as to form a structure with the semiconductor element 312 being embedded in the carrier 310, shown in FIG. 7, thereby eliminating the drawbacks encountered in packing the semiconductor element in the prior art. However, U.S. Pat. No. 7,033,862 B2 fails to disclose that the electrode 315 of the semiconductor element 312 (i.e. embedded component) is electrically connected to a circuit layer of a circuit board.

Accordingly, there exists a need for a method for manufacturing a circuit board having an embedded component therein, the method being capable of solving the above-mentioned problems.

SUMMARY OF THE INVENTION

It is an object of the present invention to provide a method for manufacturing a circuit board, the method decreasing the thickness of the electrode of the embedded component by a thickness decreasing process, whereby a patterned circuit layer can be electrically connected to the electrode certainly.

It is a further object of the present invention to provide a method for manufacturing a circuit board comprising the following steps of: providing a core layer, wherein the core layer includes a first dielectric layer, and first and second metallic layers, the first dielectric layer has upper and lower surfaces, and the first and second metallic layers are located on the upper and lower surfaces of the first dielectric layer respectively; forming a first through hole in the core layer; disposing the core layer on a supporting plate, and disposing an embedded component in the first through hole, wherein the second metallic layer contacts the supporting plate, and the embedded component has at least one electrode contacting the supporting plate; mounting the embedded component in the first through hole by an encapsulating process; removing the supporting plate; removing the first and second metallic layers and decreasing the thickness of the electrode of the embedded component by a thickness decreasing process; forming third and fourth metallic layers on the upper and lower surfaces of the first dielectric layer respectively, wherein the fourth metallic layer is electrically connected to the electrode of the embedded component; and patterning the third and fourth metallic layers so as to respectively form first and second patterned circuit layers.

According to the method of the present invention for manufacturing a circuit board, the electrode of he embedded component is located on the surface of the embedded component (the surface does not face the first dielectric layer). It is not necessary that the embedded component is electrically connected to the first surface circuit or the second surface circuit by a convention conductive via, whereby wiring areas on the first patterned circuit layer and the second patterned circuit layer can be increased, and further wiring densities on the first patterned circuit layer and the second patterned circuit layer can be increased. Furthermore, it is not necessary that the embedded component is electrically connected to the surface circuit by the convention conductive via, whereby the thickness of the whole circuit board cannot be increased. Thus, the circuit board can meet the requirements of light, thin, short and small product.

In addition, the method of the present invention for manufacturing a circuit board having an embedded component therein can decrease the thickness of the electrode of the embedded component by a thickness decreasing process, whereby the contacting surface of the electrode can be certainly exposed from the adhesive, i.e. residues of the adhesive on the contacting surface of the electrode can be certainly cleaned. Thus, the fourth metallic layer can be electrically connected to the electrode of the embedded component certainly, i.e. the second patterned circuit layer can be electrically connected to the contacting surface of the electrode of the embedded component certainly.

The foregoing, as well as additional objects, features and advantages of the invention will be more apparent from the following detailed description, which proceeds with reference to the accompanying drawings.

DETAILED DESCRIPTION OF THE PREFERRED EMBODIMENT

Figure 1:
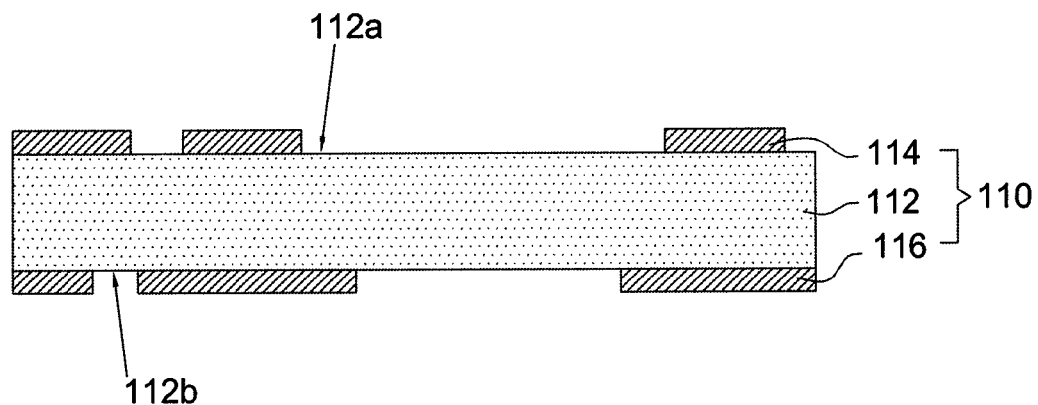
FIGS. 1 to 5 are cross-sectional views showing a method for manufacturing a circuit board having an embedded component therein in the prior art.
Figure 2:
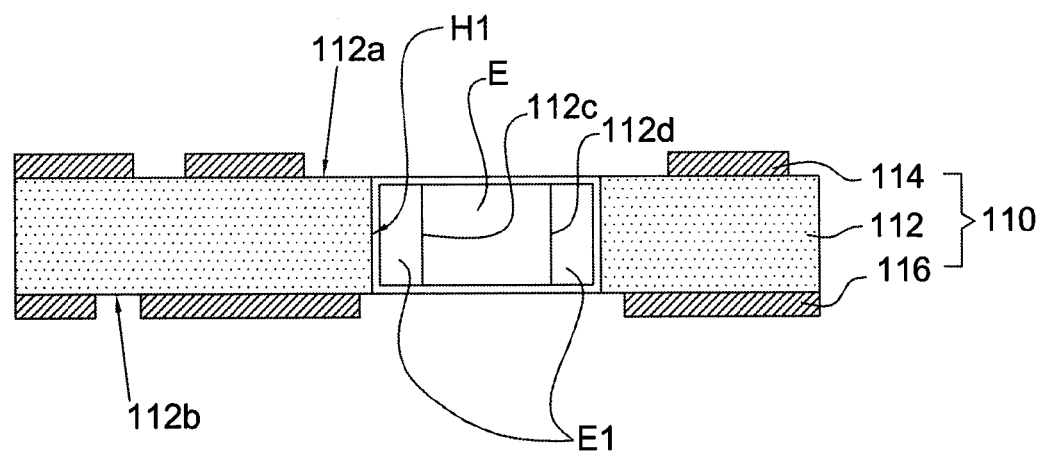
Figure 3:
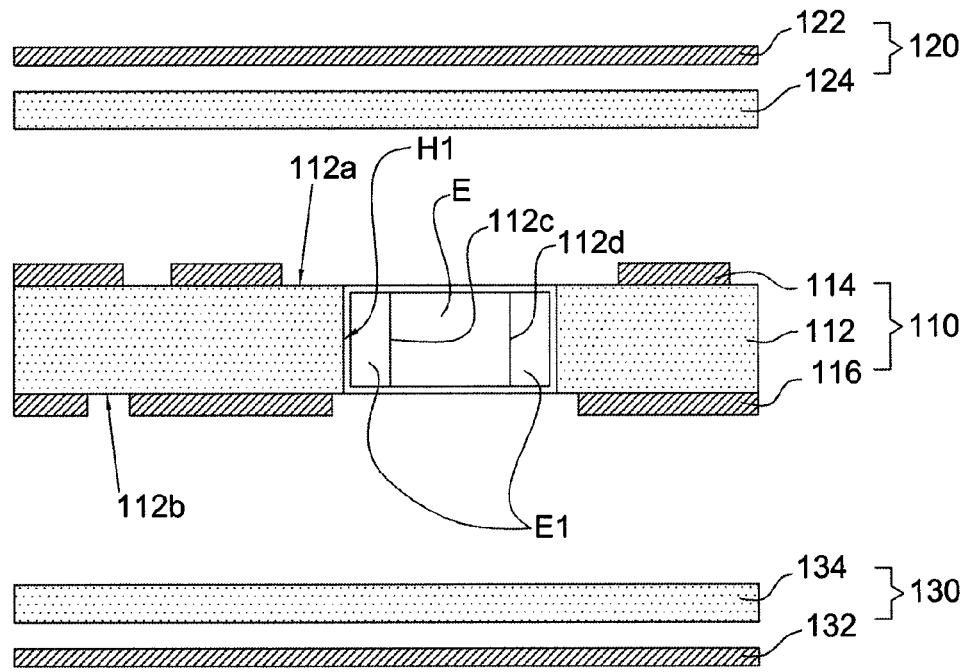
Figure 4:
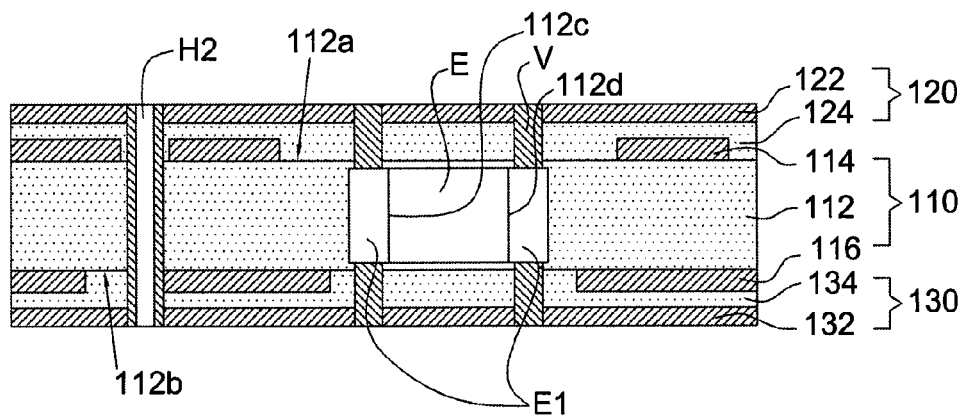
Figure 5:
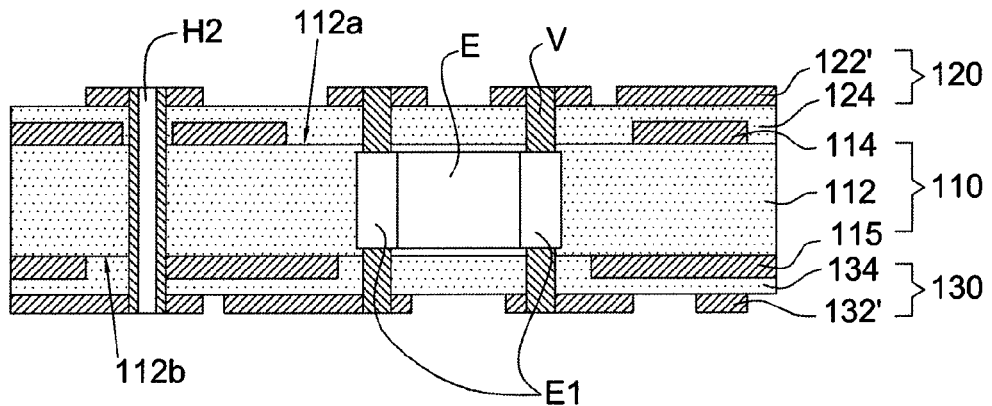
Figure 6:
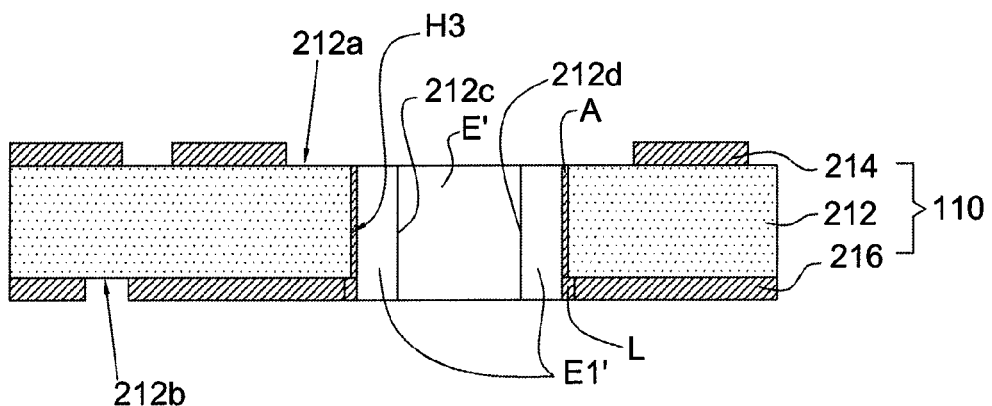
FIG. 6 is a cross-sectional view showing another method for manufacturing a circuit board having an embedded component therein in the prior art.
Figure 7:
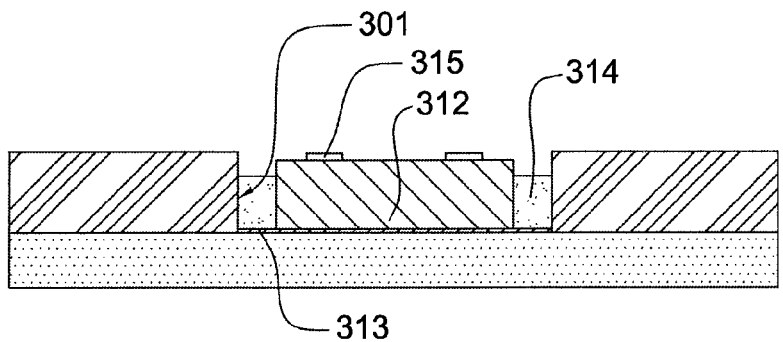
FIG. 7 is a cross-sectional view showing a method for embedding a semiconductor element in carrier in the prior art.
Figure 8:
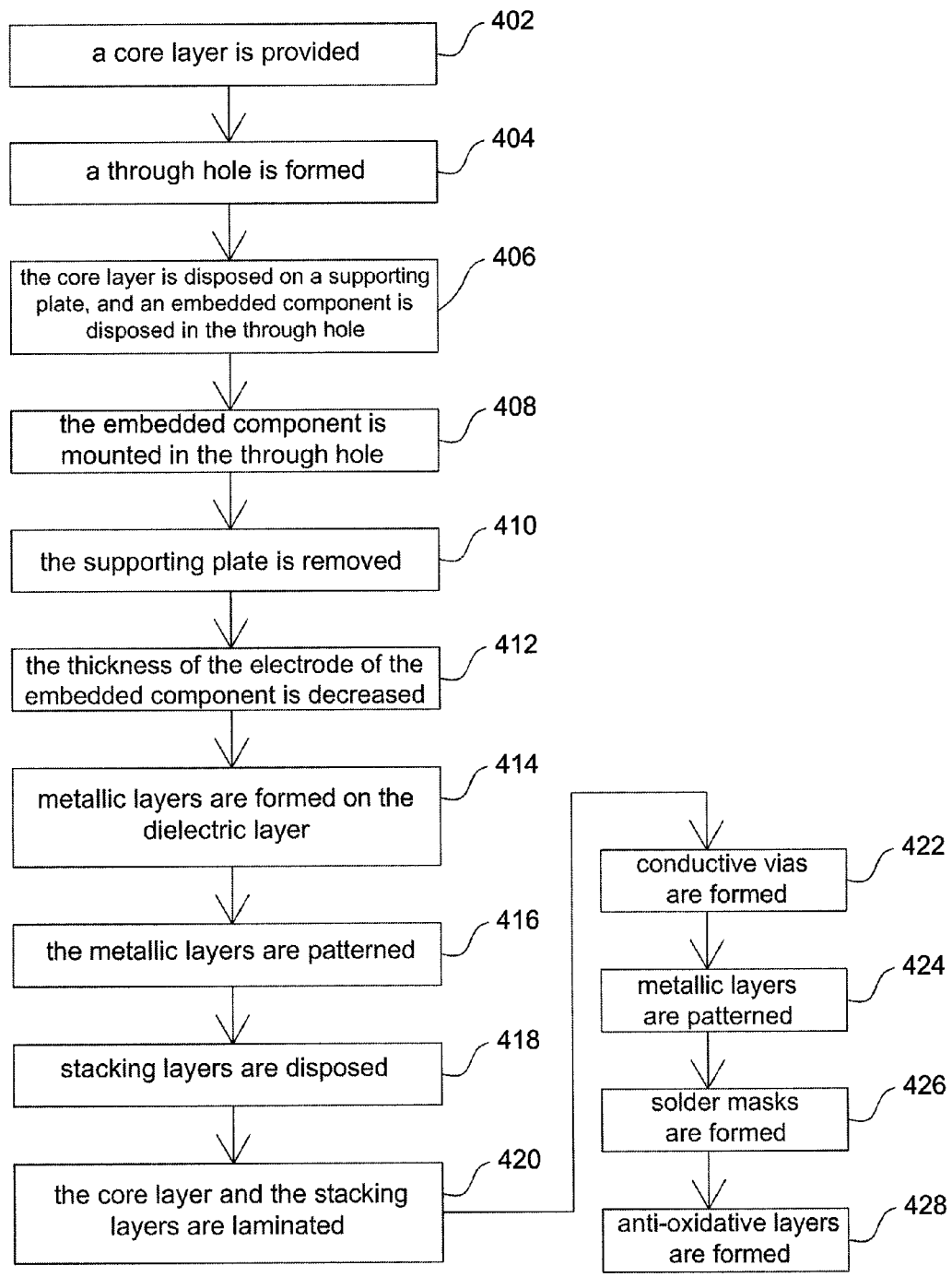
FIG. 8 is a flow diagram showing a method for manufacturing a circuit board having an embedded component therein according to a first embodiment of the present invention.
Figure 9:
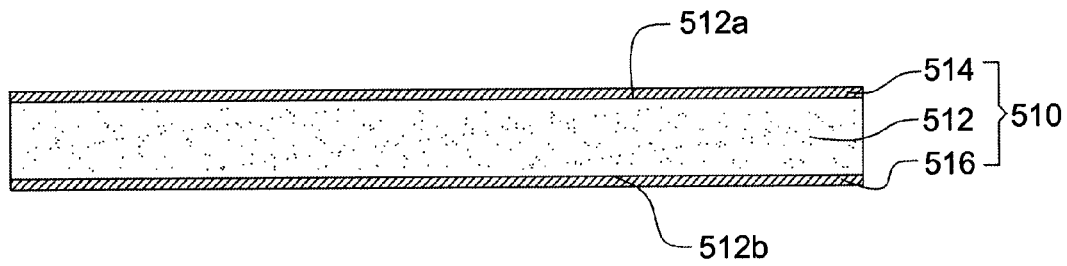
FIGS. 9 to 18 are cross-sectional views showing a method for manufacturing a circuit board having an embedded component therein according to the first embodiment of the present invention.

Referring to FIG. 8, it depicts a method for manufacturing a circuit board having an embedded component therein according to a first embodiment of the present invention. Referring to FIG. 9, in the step 402 a core layer 510 is provided, wherein the core layer 510 includes a first dielectric layer 512, and first and second metallic layers 514, 516. The first dielectric layer 512 has an upper surface 512a and a lower surface 512b, the first and second metallic layers 514, 516 are located on the upper surface 512a and the lower surface 512b of the first dielectric layer 512 respectively. In this embodiment, the first and second metallic layers 514, 516 are made of copper (Cu) and have a thickness being equal to or less than 3 micrometer (μm).

Figure 10:
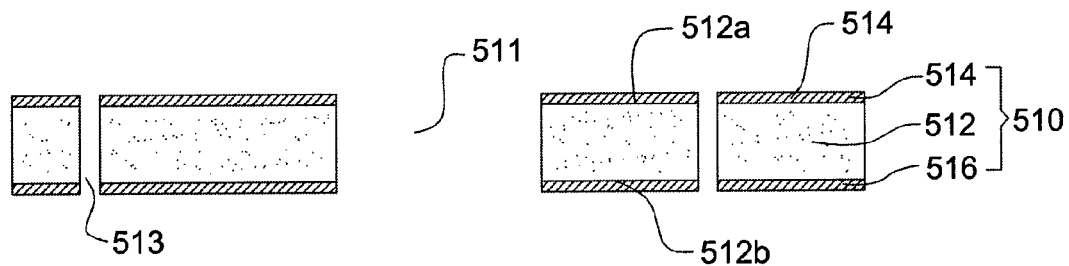

Referring to FIG. 10, in the step 404 a first through hole 511 is formed in the core layer 510. For example, the first through hole 511 can be formed in the core layer 510 by mechanic drilling process or laser drilling process. In this embodiment, at least one second through hole 513 can be simultaneously formed in the core layer 510.

Figure 11:
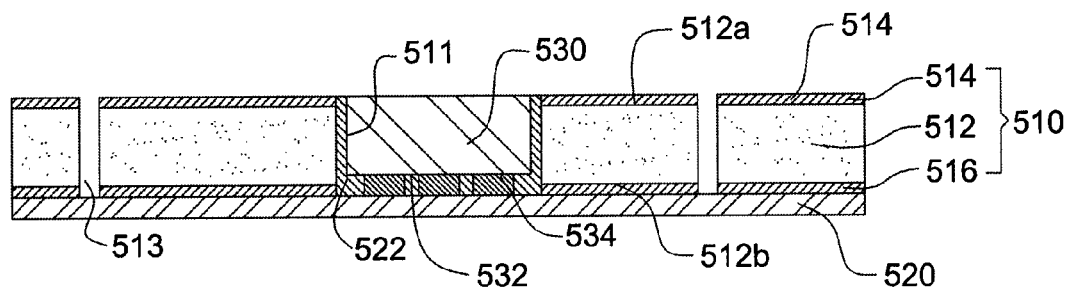

Referring to FIG. 11, in the step 406 the core layer 510 is disposed on a supporting plate 520, and an embedded component 530 is disposed in the first through hole 511. The second metallic layer 516 contacts the supporting plate 520. The embedded component 530 can be an active component or a passive component. The embedded component 530 has a surface 532 and at least one electrode 534, wherein the electrode 534 is located on the surface 532 and contacts the supporting plate 520. The surface 532 does not face the first dielectric layer 512, i.e. the surface 532 faces the supporting plate 520. In this embodiment, the supporting plate 520 can be made of glass or polyethylene terephthalate (PET). In the step 408 the embedded component 530 is mounted in the first through hole 511 by an encapsulating process. In this encapsulating process, an adhesive 522 is filled in the gap between the embedded component 530 and the first through hole 511.

Figure 12:
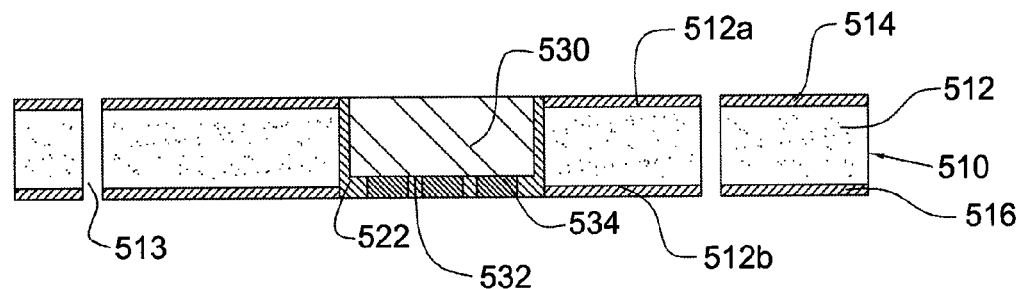
Figure 13:
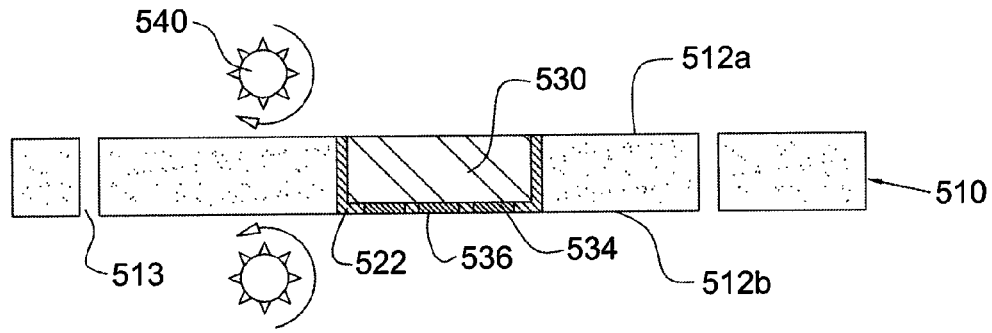

Referring to FIG. 12, in the step 410 the supporting plate 520 is removed. Referring to FIG. 13, in the step 412 the first and second metallic layers 514, 516 are removed (i.e. the thickness of the core layer 510 is decreased), and the thickness of the electrode 534 of the embedded component 530 is decreased by a thickness decreasing process, wherein the thickness difference of the decreased electrode 534 is equal to the thickness of the second metallic layer 516 of the core layer 510. For example, the thickness decreasing process can be a grinding process or a flash etching process for removing the first and second metallic layers 514, 516 and decreasing the thickness of the electrode 534 of the embedded component 530. In this embodiment, if the original thickness of the electrode 534 is more than 10 micrometer (μm) and the thickness difference of the decreased electrode 534 is 3 micrometer by a grinding device 540 (i.e. the thickness of the second metallic layers 516 is equal to 3 micrometer), the thickness of the decreased electrode 534 is still more than 7 micrometer, whereby the contacting surface 536 of the electrode 534 can be certainly exposed from the adhesive 522, i.e. residues of the adhesive 522 on the contacting surface 536 of the electrode 534 can be certainly cleaned.

Figure 14:
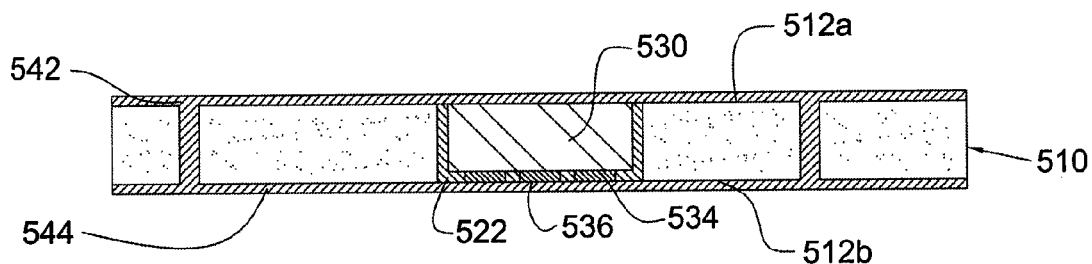

Referring to FIG. 14, in the step 414 third and fourth metallic layers 542, 544 are formed on the upper and lower surfaces 215a, 512b of the first dielectric layer 512 respectively, wherein the fourth metallic layer 542 is electrically connected to the electrode 534 of the embedded component 530. The contacting surface 536 of the electrode 534 is exposed from the adhesive 522 certainly, and thus the fourth metallic layer 542 is electrically connected to the contacting surface 536 of the electrode 534 certainly. In this embodiment, a first conductive via 546 can be simultaneously formed from the second through hole 513. The third and fourth metallic layers 542, 544 can be made of copper (Cu).

Figure 15:
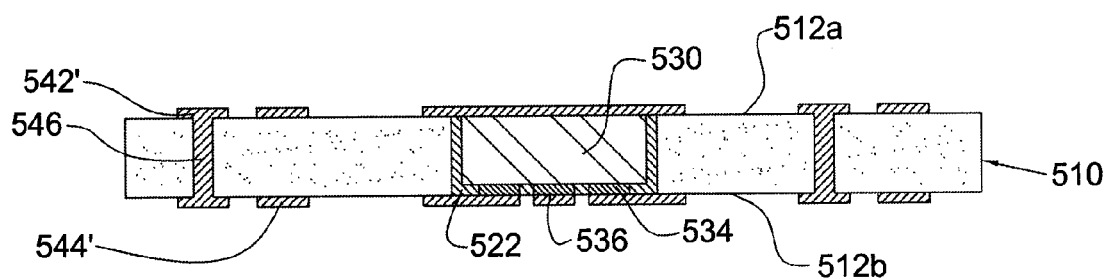

Referring to FIG. 15, in the step 416 the third and fourth metallic layers 542, 544 are patterned so as to respectively form first and second patterned circuit layers 542', 544'. For example, the third and fourth metallic layers 542, 544 are patterned to the first and second patterned circuit layers 542', 544' by photolithography and etching processes.

Figure 16:
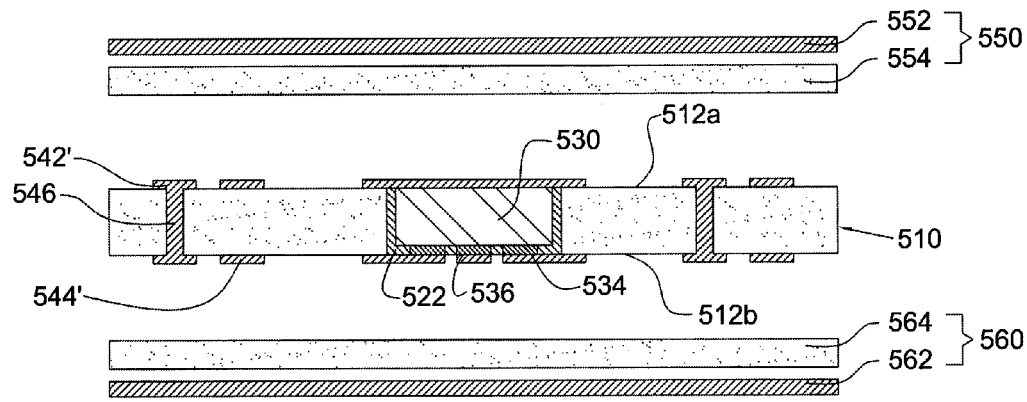

Referring to FIG. 16, in the step 418 first and second stacking layers 550, 560 are disposed on the first and second patterned circuit layers 542', 544' respectively, wherein the first stacking layer 550 includes a fifth metallic layer 552 and a second dielectric layer 554, the second stacking layer 560 includes a sixth metallic layer 562 and a third dielectric layer 564, and the second and third dielectric layers 554, 564 face the first and second patterned circuit layers 542', 544' respectively.

Figure 17:
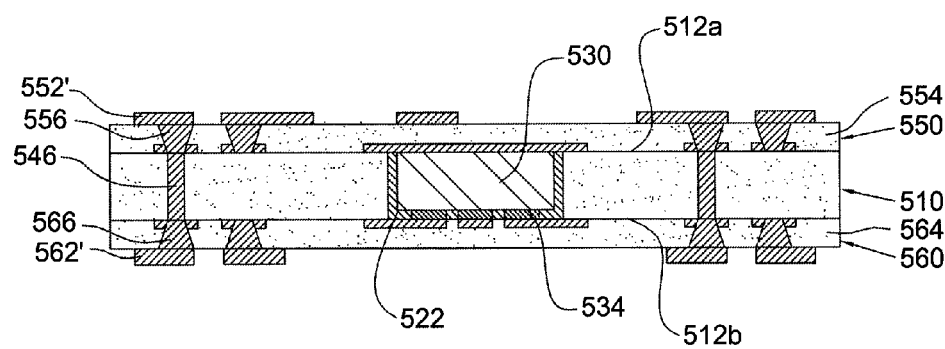

Referring to FIG. 17, in the step 420 the first stacking layer 550, the core layer 510 and the second stacking layer 560 are laminated. In the step 422 second and third conductive vias 556, 566 are formed in the first stacking layer 550 and the second stacking layer 560 respectively. In the step 424 the fifth metallic layer 552 and sixth metallic layer 562 are patterned so as to respectively form a first surface circuit 552' and a second surface circuit 562'. Also, the first surface circuit 552' and the second surface circuit 562' are electrically connected to each other by the first, second and third conductive vias 546, 556, 566.

Figure 18:
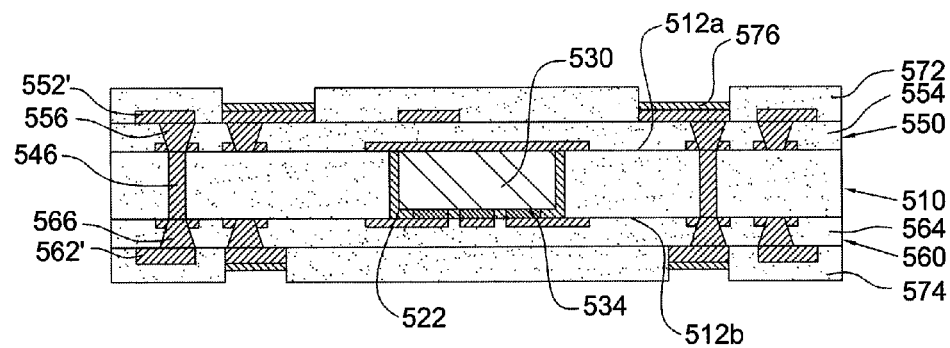

Referring to FIG. 18, in the step 426 a first solder mask 572 and a second solder mask 574 are formed on the second dielectric layer 554 and the third dielectric layer 564 respectively, wherein the first solder mask 572 exposes at least one part of the first surface circuit 552', and the second solder mask 574 exposes at least one part of the second surface circuit 562'.

In the step 428 a first anti-oxidative layer 576 is formed on the exposed part of the first surface circuit 552', and a second anti-oxidative layer 578 is formed on the exposed part of the second surface circuit 562'. The first and second anti-oxidative layers 576, 578 can be nickel (Ni) and gold (Au) layers, which are formed on the exposed parts of the first surface circuit 552' and the second surface circuit 562' respectively by electroplating processes.

According to the method of the present invention for manufacturing a circuit board having an embedded component therein, the electrode of he embedded component is located on the surface of the embedded component (the surface does not face the first dielectric layer). It is not necessary that the embedded component is electrically connected to the first surface circuit or the second surface circuit by a convention conductive via, whereby wiring areas on the first patterned circuit layer and the second patterned circuit layer can be increased, and further wiring densities on the first patterned circuit layer and the second patterned circuit layer can be increased. Furthermore, it is not necessary that the embedded component is electrically connected to the surface circuit by the convention conductive via, whereby the thickness of the whole circuit board cannot be increased. Thus, the circuit board can meet the requirements of light, thin, short and small product.

In addition, the method of the present invention for manufacturing a circuit board having an embedded component therein can decrease the thickness of the electrode of the embedded component by a thickness decreasing process, whereby the contacting surface of the electrode can be certainly exposed from the adhesive, i.e. residues of the adhesive on the contacting surface of the electrode can be certainly cleaned. Thus, the fourth metallic layer can be electrically connected to the electrode of the embedded component certainly, i.e. the second patterned circuit layer can be electrically connected to the contacting surface of the electrode of the embedded component certainly.

Figure 19:
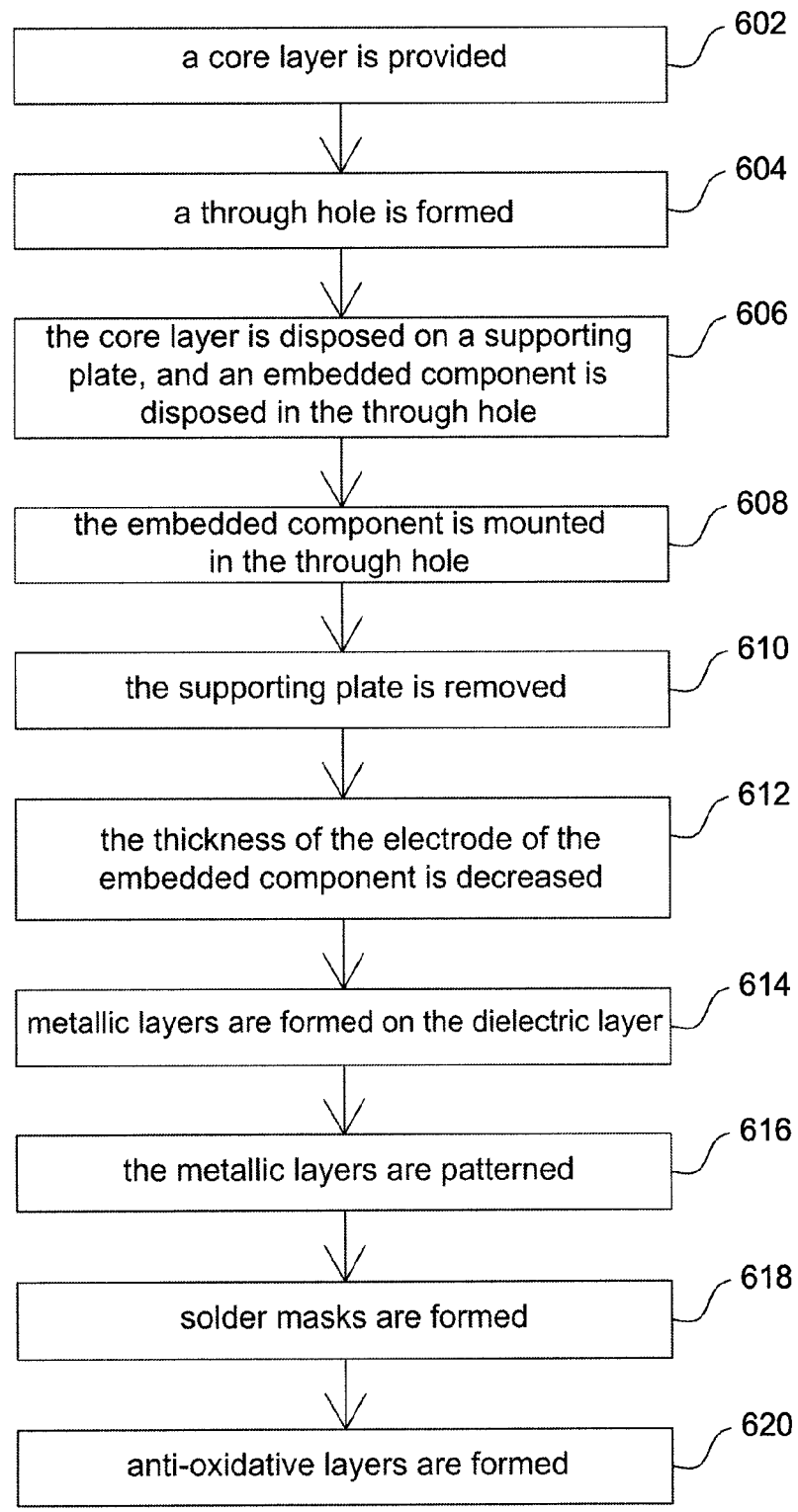
FIG. 19 is a flow diagram showing a method for manufacturing a circuit board having an embedded component therein according to a second embodiment of the present invention.
Figure 20:
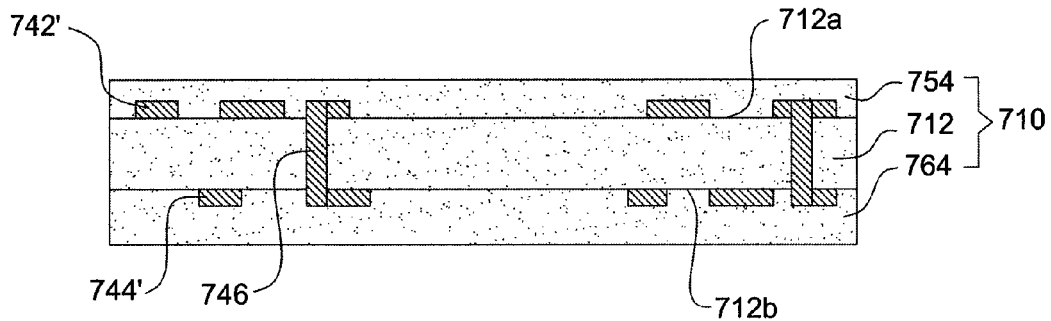
FIGS. 20 to 26 are cross-sectional views showing a method for manufacturing a circuit board having an embedded component therein according to the second embodiment of the present invention.

Referring to FIG. 19, it depicts a method for manufacturing a circuit board having an embedded component therein according to a second embodiment of the present invention. Referring to FIG. 20, in the step 602 a core layer 710 is provided, wherein the core layer 710 includes first, second and third dielectric layers 712, 754, 764, first and second patterned circuit layers 742', 744', and at least one first conductive via 746. The first dielectric layer 712 has an upper surface 712a and a lower surface 712b, and the first and second patterned circuit layers 742', 744' are located on the upper surface 712a and the lower surface 712b of the first dielectric layer 712 respectively. The second dielectric layer 754 is disposed on the upper surface 712a of the first dielectric layer 712, and covers the first patterned circuit layer 742'. The third dielectric layer 764 is disposed on the lower surface 712b of the first dielectric layer 712, and covers the second patterned circuit layer 744'. The first conductive via 746 is adapted to electrically connect the first patterned circuit layer 742' to the second patterned circuit layer 744'.

Figure 21:
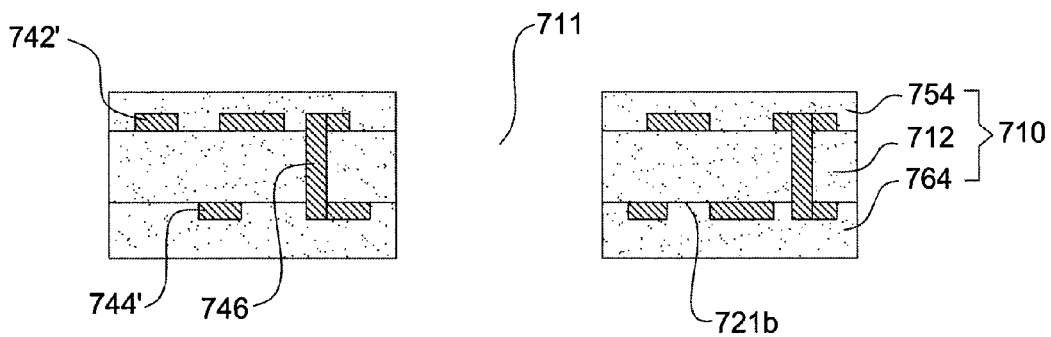

Referring to FIG. 21, in the step 604 a through hole 711 is formed in the core layer 710. For example, the through hole 711 can be formed in the core layer 710 by mechanic drilling process or laser drilling process.

Figure 22:
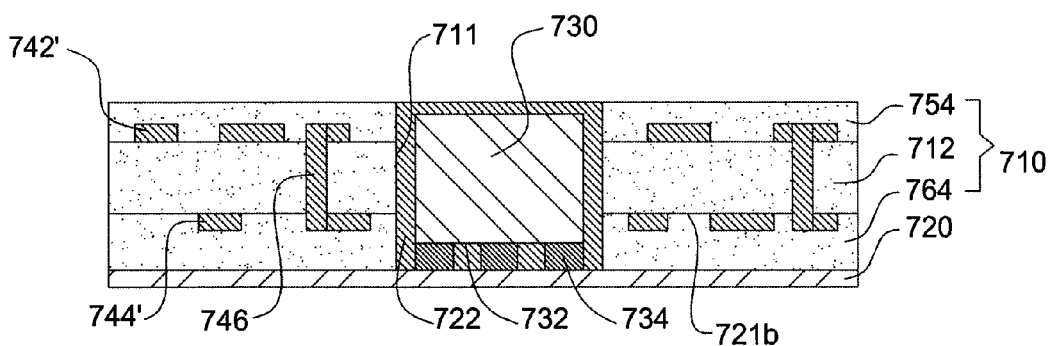

Referring to FIG. 22, in the step 606 the core layer 710 is disposed on a supporting plate 720, and an embedded component 730 is disposed in the through hole 711. The third dielectric layer 764 contacts the supporting plate 720. The embedded component 730 can be an active component or a passive component. The embedded component 730 has a surface 732 and at least one electrode 734, wherein the electrode 734 is located on the surface 732 and contacts the supporting plate 720. The surface 732 does not face the first dielectric layer 712, i.e. the surface 732 faces the supporting plate 720. In this embodiment, the supporting plate 720 can be made of glass or polyethylene terephthalate (PET). In the step 608 the embedded component 730 is mounted in the through hole 711 by an encapsulating process. In this encapsulating process, an adhesive 722 is filled in the gap between the embedded component 730 and the through hole 711.

Figure 23:
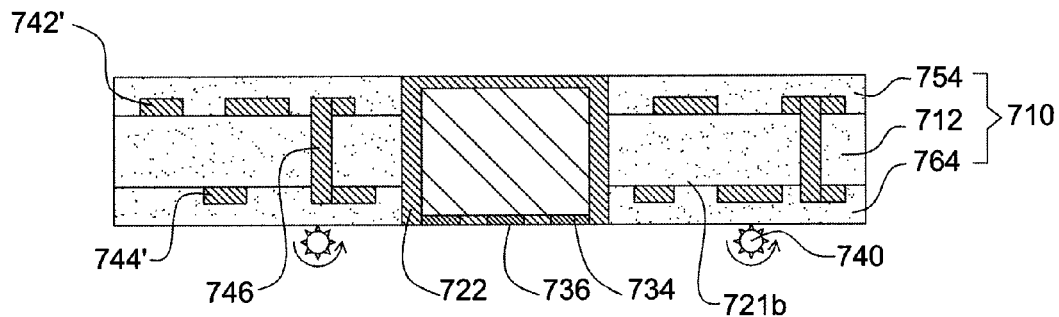
Figure 24:
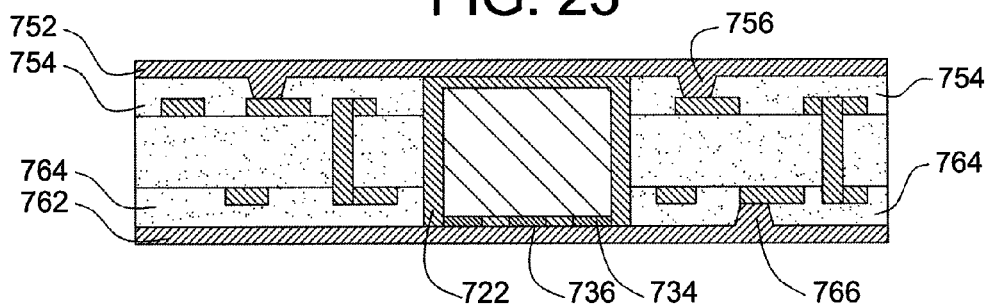

Referring to FIG. 23, in the step 610 the supporting plate 720 is removed. Referring to FIG. 24, in the step 612 the thickness of the third dielectric layer 764 of the core layer 710 is decreased (i.e. the thickness of the core layer 710 is decreased), and the thickness of the electrode 734 of the embedded component 730 is decreased by a thickness decreasing process, wherein the thickness difference of the decreased electrode 734 is equal to the thickness difference of the decreased third dielectric layer 764 of the core layer 710. For example, the thickness decreasing process can be a grinding process or a flash etching process for decreasing the thickness of the third dielectric layer 764 of the core layer 710 and decreasing the thickness of the electrode 734 of the embedded component 730. In this embodiment, the thickness difference of the decreased electrode 734 is equal to the thickness difference of the decreased third dielectric layer 764 of the core layer 710 by a grinding device 740, whereby the contacting surface 736 of the electrode 734 can be certainly exposed from the adhesive 722, i.e. residues of the adhesive 722 on the contacting surface 736 of the electrode 734 can be certainly cleaned.

Figure 25:
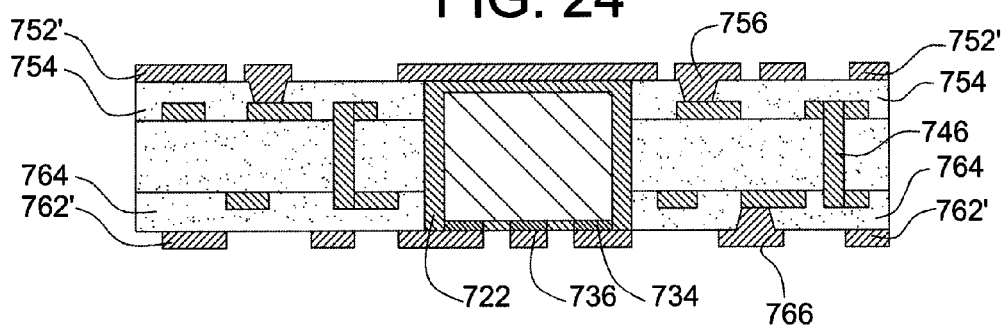

Referring to FIG. 24, in the step 614 first and second metallic layers 752, 762 are formed on the second and third dielectric layer 754, 764 respectively, wherein the second metallic layer 762 is electrically connected to the electrode 734 of the embedded component 730. The contacting surface 736 of the electrode 734 is exposed from the adhesive 722 certainly, and thus the second metallic layer 762 is electrically connected to the contacting surface 736 of the electrode 734 certainly. In this embodiment, second and third conductive vias 756, 766 can be simultaneously formed in the second and third dielectric layer 754, 764 respectively. The first and second metallic layers 752, 762 can be made of copper (Cu). Referring to FIG. 25, in the step 616 the first and second metallic layers 752, 762 are patterned so as to respectively form first and second surface circuits 752', 762', wherein the first and second surface circuits 752', 762' are electrically connected to each other by the first, second and third conductive vias 746, 756, 766.

Figure 26:
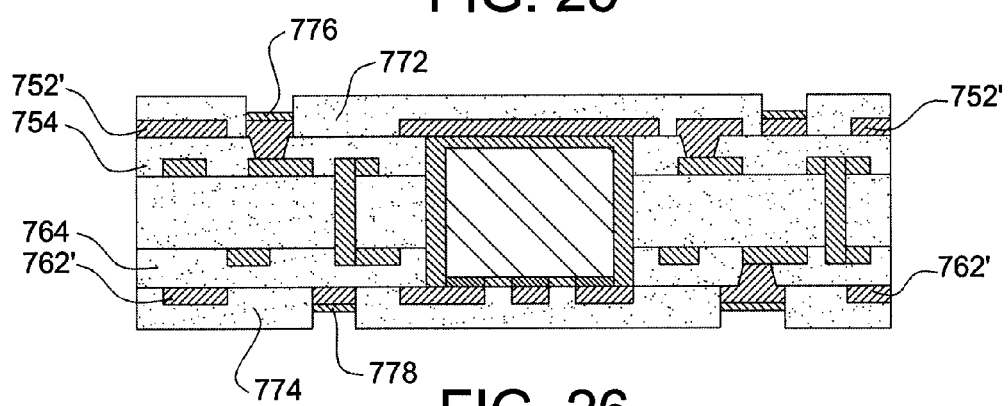

Referring to FIG. 26, in the step 618 a first solder mask 772 and a second solder mask 774 are respectively formed on the second dielectric layer 754 and the third dielectric layer 764, wherein the first solder mask 772 exposes at least one part of the first surface circuit 752', and the second solder mask 774 exposes at least one part of the second surface circuit 762'. In the step 620 a first anti-oxidative layer 776 is formed on the exposed part of the first surface circuit 752', and a second anti-oxidative layer 778 is formed on the exposed part of the second surface circuit 762'.

According to the method of the present invention for manufacturing a board having an embedded component therein, the electrode of he embedded component is located on the surface of the embedded component (the surface does not face the first dielectric layer). It is not necessary that the embedded component is electrically connected to the first surface circuit or the second surface circuit by a convention conductive via, whereby wiring areas on the first patterned circuit layer and the second patterned circuit layer can be increased, and further wiring densities on the first patterned circuit layer and the second patterned circuit layer can be increased. Furthermore, it is not necessary that the embedded component is electrically connected to the surface circuit by the convention conductive via, whereby the thickness of the whole circuit board cannot be increased. Thus, the circuit board can meet the requirements of light, thin, short and small product.

In addition, the method of the present invention for manufacturing a board having an embedded component therein can decrease the thickness of the electrode of the embedded component by a thickness decreasing process, whereby the contacting surface of the electrode can be certainly exposed from the adhesive, i.e. residues of the adhesive on the contacting surface of the electrode can be certainly cleaned. Thus, the second metallic layer can be electrically connected to the electrode of the embedded component certainly, i.e. the second surface circuit can be electrically connected to the contacting surface of the electrode of the embedded component certainly.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A method for manufacturing a circuit board comprising the following steps of:

providing a core layer, wherein the core layer includes a first dielectric layer, and first and second metallic layers, the first dielectric layer has upper and lower surfaces, and the first and second metallic layers are located on the upper and lower surfaces of the first dielectric layer respectively;

forming a first through hole in the core layer;
disposing the core layer on a supporting plate, and disposing an embedded component in the first through hole, wherein the second metallic layer contacts the supporting plate, and the embedded component has at least one electrode contacting the supporting plate;
mounting the embedded component in the first through hole by an encapsulating process;
removing the supporting plate;
removing the first and second metallic layers and decreasing the thickness of the electrode of the embedded component by a thickness decreasing process;
forming third and fourth metallic layers on the upper and lower surfaces of the first dielectric layer respectively, wherein the fourth metallic layer is electrically connected to the electrode of the embedded component; and
patterning the third and fourth metallic layers so as to respectively form first and second patterned circuit layers.

2. The method as claimed in claim 1, wherein during the step of decreasing the thickness of the electrode, the thickness difference of the decreased electrode is equal to the thickness of the second metallic layer.

3. The method as claimed in claim 1, wherein the thickness decreasing process is one of a grinding process and a flash etching process.

4. The method as claimed in claim 1, wherein the encapsulating process comprises the step of filling an adhesive in the gap between the embedded component and the first through hole.

5. The method as claimed in claim 1, wherein the embedded component has a surface facing the supporting plate, and the electrode is located on the surface of the embedded component.

6. The method as claimed in claim 1, wherein during the step of forming the first through hole in the core layer, and the method further comprising the step of:
simultaneously forming at least one second through hole in the core layer.

7. The method as claimed in claim 6, wherein during the step of respectively forming third and fourth metallic layers on the upper and lower surfaces of the first dielectric layer, and the method further comprising the step of:
simultaneously forming a first conductive via from the second through hole.

8. The method as claimed in claim 1, wherein after the step of forming first and second patterned circuit layers, and the method further comprising the steps of:
desposing first and second stacking layers on the first and second patterned circuit layers respectively, wherein the first stacking layer includes a fifth metallic layer and a second dielectric layer, the second stacking layer includes a sixth metallic layer and a third dielectric layer, and the second and third dielectric layers face the first and second patterned circuit layers respectively;
laminating the first stacking layer, the core layer and the second stacking layer;
forming second and third conductive vias in the first stacking layer and the second stacking layer respectively; and
patterning the fifth metallic layer and sixth metallic layer so as to respectively form a first surface circuit and a second surface circuit, wherein the first surface circuit and the second surface circuit are electrically connected to each other by the first, second and third conductive vias.

9. A method for manufacturing a circuit board comprising the following steps of:
providing a core layer, wherein the core layer includes first, second and third dielectric layers, first and second patterned circuit layers and at least one first conductive via, the first dielectric layer has upper and lower surfaces, the first and second patterned circuit layers are located on the upper and lower surfaces of the first dielectric layer respectively, the second dielectric layer is disposed on the upper surface of the first dielectric layer and covers the first patterned circuit layer, the third dielectric layer is disposed on the lower surface of the first dielectric layer and covers the second patterned circuit layer, and the first conductive via is adapted to electrically connect the first patterned circuit layer to the second patterned circuit layer;
forming a first through hole in the core layer;
disposing the core layer on a supporting plate, and disposing an embedded component in the through hole, wherein the third dielectric layer contacts the supporting plate, and the embedded component has at least one electrode contacting the supporting plate;
mounting the embedded component in the through hole by an encapsulating process;
removing the supporting plate;
decreasing the thickness of the third dielectric layer of the core layer and the thickness of the electrode of the embedded component by a thickness decreasing process;
forming first and second metallic layers on the second and third dielectric layers respectively, wherein the second metallic layer is electrically connected to the electrode of the embedded component; and
patterning the first and second metallic layers so as to respectively form first and second surface circuits.

10. The method as claimed in claim 9, wherein during the step of decreasing the thickness of the third dielectric layer of the core layer and the thickness of the electrode of the embedded component, the thickness difference of the decreased electrode is equal to the thickness difference of the decreased third dielectric layer.

11. The method as claimed in claim 9, wherein the thickness decreasing process is one of a grinding process and a flash etching process.

12. The method as claimed in claim 9, wherein the encapsulating process comprises the step of filling an adhesive in the gap between the embedded component and the through hole.

13. The method as claimed in claim 9, wherein the embedded component has a surface facing the supporting plate, and the electrode is located on the surface of the embedded component.

14. The method as claimed in claim 9, wherein during the step of forming first and second metallic layers on the second and third dielectric layer respectively, and the method further comprising the step of:
simultaneously forming second and third conductive vias in the second and third dielectric layer respectively, wherein the first surface circuit and the second surface circuit are electrically connected to each other by the first, second and third conductive vias.

15. A method for decreasing a thickness of an electrode of an embedded component of a circuit board comprising the following steps of:
providing a core layer;
forming a through hole in the core layer;

disposing the core layer on a supporting plate, and disposing an embedded component in the through hole, wherein the embedded component has at least one electrode contacting the supporting plate;

mounting the embedded component in the through hole by an encapsulating process;

removing the supporting plate; and decreasing a thickness of the core layer and the thickness of the electrode of the embedded component by a thickness decreasing process;

wherein a thickness difference of the decreased electrode is equal to a thickness difference of the decreased core layer.

16. The method as claimed in claim 15, wherein the thickness decreasing process is one of a grinding process and a flash etching process.

17. The method as claimed in claim 15, wherein the encapsulating process comprises the step of filling an adhesive in the gap between the embedded component and the through hole.

18. The method as claimed in claim 15, wherein the embedded component has a surface facing the supporting plate, and the electrode is located on the surface of the embedded component.

* * * * *